United States Patent [19]

Nakamura

[11] Patent Number: 4,591,811
[45] Date of Patent: May 27, 1986

[54] GENERATOR FOR GENERATING AN AMPLITUDE MODULATED SIGNAL CORRESPONDING TO A CARRIER SIGNAL MODULATED BY AN INFORMATION SIGNAL

[75] Inventor: Takeshi Nakamura, Uji, Japan

[73] Assignee: Murata Manufacturing Co., Ltd., Kyoto, Japan

[21] Appl. No.: 667,372

[22] Filed: Nov. 1, 1984

[30] Foreign Application Priority Data

Nov. 25, 1983 [JP] Japan .................... 58-182363[U]

[51] Int. Cl.$^4$ .................................................. H03C 1/00
[52] U.S. Cl. ..................................... 332/31 T; 332/48; 332/52
[58] Field of Search .............. 332/31 T, 31 R, 48, 332/52, 63; 455/108

[56] References Cited

U.S. PATENT DOCUMENTS

| | | | |
|---|---|---|---|
| 3,624,559 | 11/1971 | Schneperkoetter et al. | 332/31 R X |
| 3,898,590 | 8/1975 | Swanson | 332/31 T |
| 3,974,460 | 8/1976 | Hongu et al. | 332/31 T |
| 4,313,094 | 1/1982 | Grogan | 332/52 X |

Primary Examiner—Eugene R. LaRoche
Assistant Examiner—Robert J. Pascal
Attorney, Agent, or Firm—Wenderoth, Lind & Ponack

[57] ABSTRACT

An amplitude-modulated generator includes a phase dividing circuit having a transistor which receives a modulating signal. The transistor is capable of generating from its emitter a first signal matched in phase with the modulating signal and from its collector a second signal opposite in phase with respect to the modulating signal. First and second switching diodes are provided which are alternately driven by a carrier wave and connected in opposite directions with each other between the emitter and the collector of the transistor. The carrier wave is applied to the junction between the first and second switching diodes. A signal is produced from the junction which is very similar to an amplitude modulated signal consisting of a carrier wave which is amplitude modulated by the modulating signal.

3 Claims, 5 Drawing Figures

Fig. 2(a)
Fig. 2(b)
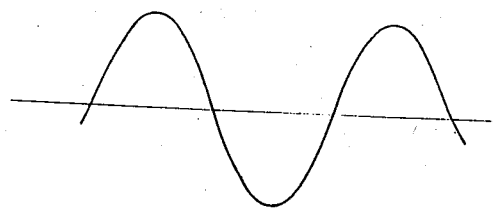
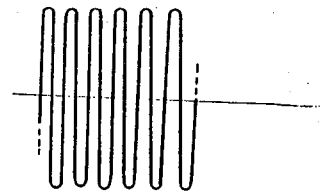
Fig. 2(c)
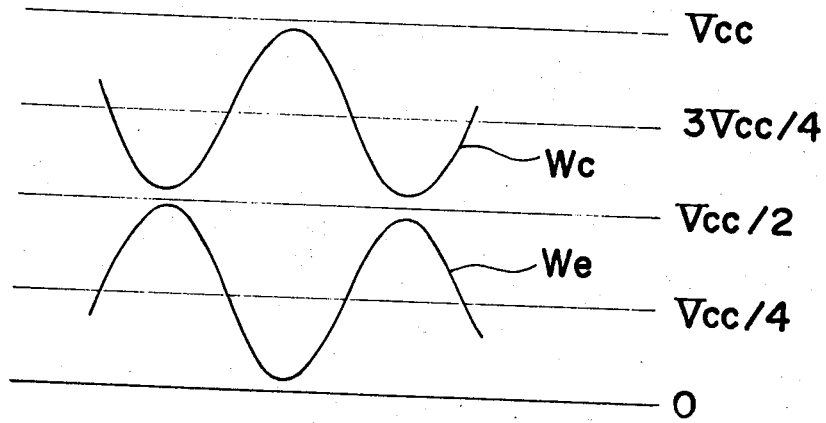
Fig. 2(d)
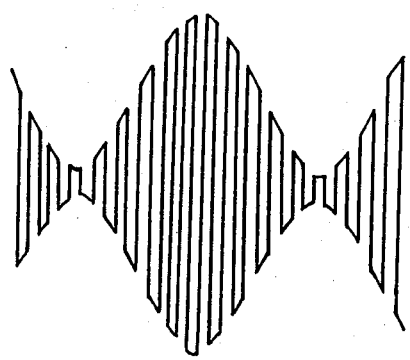

GENERATOR FOR GENERATING AN AMPLITUDE MODULATED SIGNAL CORRESPONDING TO A CARRIER SIGNAL MODULATED BY AN INFORMATION SIGNAL

BACKGROUND OF THE INVENTION

The present invention relates to an amplitude-modulated signal generator.

In the field of a radiocommunication, an amplitude-modulated signal generator is employed for the amplitude modulation of a carrier wave in accordance with a suitable information wave. A number of amplitude-modulated single generators have been proposed, and the ones which employ transistor are known as a base modulation type, an emitter modulation type and a collector modulation type, all of which need a transformer.

Since any one of these conventional amplitude-modulated signal generators requires the use of a transformer, the generator becomes bulky in size and it requires a high manufacturing cost. Particularly, when the conventional amplitude-modulated signal generator is used in an ultrasonic wave generator capable of generating an ultrasonic signal of relatively low frequency, for example, 30 to 500 KHz, the transformer must have a high inductance, resulting in a very large size generator. Furthermore, a precise adjustment is necessary.

On the other hand, an amplitude-modulated signal generator using no transformer is also well known. One amplitude-modulated generator of this type includes a circuit wherein an electric current generated from a constant current source defined by a differential amplifier is varied by a carrier wave to produce an amplitude modulated wave. Another known type is a product modulating circuit wherein an analog multiplier is utilized. However, these modulating circuits are complicated in circuit arrangement and, requires a high manufacturing cost, particularly when they are desired to be fabricated in a compact size.

SUMMARY OF THE INVENTION

The present invention has been developed with a view to substantially eliminating the above discussed disadvantages inherent in the prior art amplitude-modulated generator and has for its essential object to provide an improved amplitude-modulated signal generator which does not require the use of any transformer and which requires no circuit adjustment and which can be manufactured at a minimized cost with a minimized number of component parts.

To this end, the amplitude-modulated signal generator according to the present invention is featured in that a signal in phase with the modulating signal produced from an emitter of a transistor and a signal opposite in phase with respect to the same modulating signal produced from a collector of a transistor are alternately transmitted at the frequency of carrier wave by switching diodes. The switching diodes are driven alternately by the carrier wave. Accordingly a produced signal is very similar to the amplitude modulated signal in which the carrier wave is amplitude modulated by the modulating signal.

BRIEF DESCRIPTION OF THE DRAWINGS

These and other objects and features of the present invention will become readily understood from the following description taken in conjunction with a preferred embodiment with reference to the accompanying drawings, in which:

FIG. 2(a) is a diagram showing the waveform of a modulating signal;

FIG. 2(b) is a diagram showing the waveform of a carrier wave;

FIG. 2(c) is a diagram showing the waveform of an output from a phase divider circuit used in the amplitude-modulated generator of FIG. 1; and FIG. 2(d) is a diagram showing the waveform of an amplitude modulated output generated from the amplitude-modulated generator of FIG. 1.

DETAILED DESCRIPTION OF THE EMBODIMENT

Figure 1:
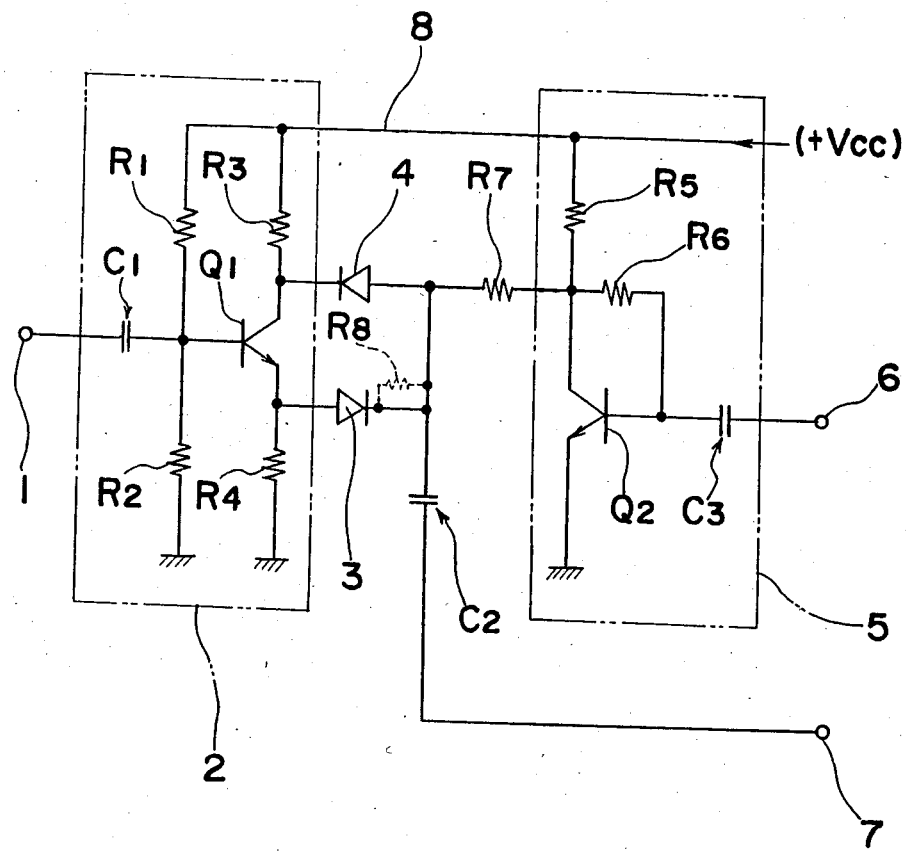
FIG. 1 is a circuit diagram showing an amplitude-modulated generator according to the present invention.

Referring first to FIG. 1, an amplitude-modulated signal generator shown therein comprises input terminal 1 to which a modulating signal is supplied, phase dividing circuit 2, and a pair of switching diodes 3 and 4 connected in parallel to each other in the opposite sense of polarity. It further comprises carrier wave amplifier 5, having input terminal 6 to which the carrier wave is supplied. Output terminal 7 is provided for producing an amplitude modulated signal.

Phase dividing circuit 2 comprises a coupling capacitor $C_1$, series-connected bias resistors $R_1$ and $R_2$, n-p-n type transistor $Q_1$ and series-connected load resistors $R_3$ and $R_4$. Bias resistor $R_1$ is inserted between the base of transistor $Q_1$ and power source line 8, and bias resistor $R_2$ is inserted between the base of transistor $Q_1$ and the ground. Load resistor $R_3$ is inserted between the collector of transistor $Q_1$ and power source line 8, and load resistor $R_4$ is inserted between the emitter of transistor $Q_1$ and the ground. A junction between bias resistors $R_1$ and $R_2$ which is connected to the base of transistor $Q_1$ is connected to input terminal 1 through coupling capacitor $C_1$.

Switching diode 3 has its anode and cathode connected respectively to the emitter of transistor $Q_1$ and the anode of the switching diode 4 having its cathode connected to the collector of the transistor $Q_1$. A junction between the cathode of switching diode 3 and the anode of switching diode 4 is in turn connected through coupling capacitor $C_2$ to output terminal 7 and also through load resistor $R_7$ to amplifier 5.

Amplifier 5 comprises n-p-n type transistor $Q_2$ having its emitter connected to the ground and its base connected through coupling capacitor $C_3$ to input terminal 6. Bias resistor $R_6$ is connected between the base and the collector of transistor $Q_2$, and load resistor $R_5$ is connected between the collector of transistor $Q_2$ and power source line 8. The collector of transistor $Q_2$ is also connected to load resistor $R_7$ which is in turn connected to the junction between the respective cathode and anode of switching diodes 3 and 4 as hereinbefore described.

It is to be noted that load resistors $R_3$ and $R_4$ have their respective resistances approximately equal to each other. It is also to be noted that the resistances of the respective bias resistors $R_1$ and $R_2$ are so selected that, for a given power source voltage $+Vcc$ supplied to power source line 8, and assuming that no modulating signal is applied to input terminal 1, the D.C. potentials at the emitter and collector of transistor $Q_1$ are $Vcc/4$ and $3Vcc/4$, respectively.

While the amplitude-modulated generator is constructed as hereinbefore described, it operates in the following manner.

Assuming that the modulating signal has a waveform shown in FIG. 2(a) and is fed to input terminal 1 while the carrier wave having a frequency sufficiently higher than that of the modulating signal, such as shown in FIG. 2(b), is fed to input terminal 6, the potential at the emitter of transistor $Q_1$ varies in accordance with the modulating signal applied to the base of transistor $Q_1$, fluctuating above and below the D.C. potential of Vcc/4 in the same phase as the modulating signal, as shown by waveform We in FIG. 2(c). On the other hand, the potential at the collector of transistor $Q_1$ fluctuates above and below the D.C. potential of 3Vcc/4 in the opposite phase to the modulating signal applied to the base of transistor $Q_1$, as shown by waveform Wc in FIG. 2(c).

Accordingly, a phase-matched signal We, matched in phase with the modulating signal, and a phase-reversed signal Wc, in a phase opposite to that of the modulating signal, are generated respectively from the emitter and the collector of transistor $Q_1$.

When the carrier wave, as shown in FIG. 2(b) is applied to input terminal 6, transistor Q2 turns on during the positive-going half-cycle of the carrier wave thereby producing a LOW signal at the collector of transistor Q2. Then, during the negative-going half-cycle of the same, transistor Q2 turns off, thereby producing a HIGH signal at the collector of transistor Q2.

When the collector of transistor Q2 produces LOW as the result of the switch on of transistor Q2 as hereinabove described, the cathode of switching diode 3 and the anode of switching diode 4 are connected to the ground through the resistor $R_7$ and transistor $Q_2$. In such a condition, switching diode 4 is turned off because the anode potential thereof is lower than the cathode potential thereof, and, at the same time, switching diode 3 is turned on because the cathode potential thereof is lower than the anode potential thereof.

When switching diodes 3 and 4 are, respectively, switched on and off during the positive-going half-cycle of the carrier wave, the phase-matched signal We from the emitter of transistor $Q_1$ is transmitted to output terminal 7 through the coupling capacitor $C_2$.

On the contrary, when the collector of transistor $Q_2$ produces HIGH during the negative-going half-cycle of the carrier wave as the result of the switch off of transistor $Q_2$, the cathode of switching diode 3 and the anode of switching diode 4 are connected to power source line 8 through load resistors $R_7$ and $R_5$. When so connected, switching diode 3 is turned off because the cathode potential thereof is higher than the anode potential thereof and, at the same time, switching diode 4 is turned on because the anode potential thereof is higher than the cathode potential thereof.

When switching diodes 3 and 4 are, respectively, switched off and on during the negative-going half-cycle of the carrier wave, the phase-reversed signal Wc from the collector of transistor $Q_1$ is transmitted to output terminal 7 through coupling capacitor $C_2$.

Therefore, from output terminal 7, the phase-matched and phase-reversed signals We and Wc are alternately generated during each complete cycle of the carrier wave and, accordingly, a signal very similar to the amplitude modulated signal wherein the carrier wave is amplitude modulated by the modulating signal as shown in FIG. 2(d) can be obtained.

It has now become clear that, in the construction of the amplitude-modulated signal generator according to the present invention, the phase dividing circuit 2 can be constructed with the minimized number of component parts, such as transistor $Q_1$, bias resistors $R_1$ and $R_2$ and load resistors $R_3$ and $R_4$. Furthermore, no need to use any transformer.

According to the embodiment described above in connection to FIG. 1, when transistor $Q_2$ is switched on, resistors $R_4$ and $R_7$ are parallelly connected between the emitter of transistor $Q_1$ and the ground and, therefore, the load resistance of transistor $Q_1$ at the emitter thereof can be given by $R_4//R_7$. When transistor $Q_2$ is switched off, resistor $R_3$ and series resistors $R_7$ and $R_5$ are parallelly connected between the collector of transistor $Q_1$ and the voltage source +Vcc. Therefore, the load resistance of transistor $Q_1$ at the collector thereof can be given by $R_3//(R_5+R_7)$. Accordingly, when the loads on the emitter and collector sides of transistor $Q_1$ are desired to be counterbalanced, resistors $R_3$, $R_4$, $R_7$ and $R_5$ should be so selected as to meet the following requirement:

$$R_3 = R_4, R_4 < R_7 \text{ and } R_7 >> R_5.$$

It is desired to further counterbalance between the loads connected to emitter and collector of transistor $Q_1$, load adjusting resistor $R_8$ having a resistance equal to that of the load resistor $R_5$ may be connected between the cathode of the switching diode 3 and the anode of the switching diode 4 as shown by a dotted line in FIG. 1.

Moreover, in place of carrier wave amplifier 5, a carrier wave oscillator may be used for driving the switching diodes 3 and 4 alternately.

In addition, although the transistors $Q_1$ and $Q_2$ have been described and shown as an n-p-n type, they may be a p-n-p type or a field-effect transistor.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of appended claims.

I claim:

1. An amplitude-modulated generator which comprises:

a phase dividing circuit having a first transistor to which a modulating signal is supplied, said first transistor generating a first signal from its emitter and a second signal from its collector, said first and second signals having a waveform which is similar to that of said modulating signal but the phase of said first signal being opposite to that of the second signal;

a first switching means connected to the emitter of said first transistor;

a second switching means connected to the collector of said first transistor, said first and second switching means connected to said first transistor in opposite direction;

a driving means for driving said first and second switching means in accordance with a carrier wave having a waveform which consists of alternately repeated first and second half-cycles such that said first and second switching means are turned on and off, respectively, during the first half-cycles of said carrier wave, and said first and second switching means are turned off and on, respectively, during the second half-cycles of said carrier wave; and an output means connected to said first and second switching means for outputting said first and second signals alternately at a rate corresponding to the frequency of said carrier wave, whereby a signal produced from said output means is substantially equivalent to an amplitude-modulated signal consisting of a carrier wave which is amplitude modulated by the modulating signal.

2. An amplitude-modulated generator of claim 1, wherein said first and second switching means comprise first and second switching diodes.

3. An amplitude-modulated generator of claim 2, wherein said driving means comprises a second transistor to which said carrier wave is supplied, said second transistor being connected to said first and second switching diodes.

* * * * *